(12) United States Patent
Roitman et al.

(10) Patent No.: US 6,713,955 B1
(45) Date of Patent: Mar. 30, 2004

(54) ORGANIC LIGHT EMITTING DEVICE HAVING A CURRENT SELF-LIMITING STRUCTURE

(75) Inventors: Daniel B. Roitman, Menlo Park, CA (US); Ronald L. Moon, Atherton, CA (US); Homer Antoniadis, Mountain View, CA (US); James R. Sheats, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/197,012

(22) Filed: Nov. 20, 1998

(51) Int. Cl.[7] ............................................... H05B 33/02
(52) U.S. Cl. ...................... 313/504; 313/506; 313/509
(58) Field of Search ................................. 313/504, 506, 313/509, 500; 257/40; 338/225 D; 428/690, 917; 315/169.3

(56) References Cited

U.S. PATENT DOCUMENTS

| | | | |
|---|---|---|---|
| 4,647,813 A | | 3/1987 | Kitabayashi et al. ........ 313/509 |
| 5,414,403 A | * | 5/1995 | Greuter et al. ................. 338/22 |
| 5,721,562 A | * | 2/1998 | Kawashima et al. .......... 345/76 |
| 5,739,545 A | | 4/1998 | Guha et al. .................... 257/40 |
| 5,920,080 A | * | 7/1999 | Jones ............................ 257/40 |

* cited by examiner

Primary Examiner—Nimeshkumar D. Patel
Assistant Examiner—Karabi Guharay

(57) ABSTRACT

An organic light emitting device having a process compatible current self-limiting (CSL) structure applied in the vicinity of an electrode of the device prevents the occurrence of high current flow in the vicinity of a short within the device. Should a short occur, the CSL structure becomes resistive, or non-conducting in the vicinity of the short, thus preventing the occurrence of "runaway" current in the vicinity of the short. By limiting the current flow between conductors in the device, the non-emissive areas of the device can be minimized, thus improving the overall reliability of the device.

19 Claims, 9 Drawing Sheets

ORGANIC LIGHT EMITTING DEVICE HAVING A CURRENT SELF-LIMITING STRUCTURE

BACKGROUND OF THE INVENTION

1. Field of the Invention

The present invention relates generally to light emitting devices, and, more particularly, to a structure for improving the reliability of organic and polymer light emitting devices and a method for producing same.

2. Related Art

Light emitting devices are used for many applications including electronics, communication systems, computer systems, and display systems. Light emitting devices are produced in many forms from a variety of materials using a variety of processes. Polymer and organic light emitting devices (OLED's) are typically used in display system applications where high power efficiency (on the order of greater than 1 lumen/watt (Lm/W) with low supply voltages (on the order of 2.5 to 15 volts (V)) are particularly desirable.

Device reliability is typically the most difficult problem to overcome when fabricating and using OLED's.

FIG. 1 is a cross-sectional view illustrating the layer construction of a typical prior art OLED 11. Transparent conducting anode 22, typically fabricated from Indium Tin Oxide (ITO) is applied over a transparent substrate 21. ITO anode 22 forms the positive terminal of device 11. Transparent substrate 21 may be, for example, glass or plastic. Over ITO anode 22 is applied one or more organic layers known to those skilled in the art as an organic stack 29. Organic stack 29 may include, for example, hole transport layer 24, electroluminescent layer 26, and electron transport layer 27. Organic stack 29 is typically not thicker than 300–500 nanometers (nm). Cathode layer 28 is applied over organic stack 29 and forms the negative terminal of OLED device 11. Cathode layer 28 is typically a metal capable of injecting electrons into organic stack 29. The cathode material is typically a metal of relatively low work function such as magnesium (Mg), cadmium (Ca), Ytterbium (Yb), lithium-aluminum (LiAl) alloys, etc.

Light is generated in organic stack 29 by the recombination of holes injected from the ITO anode 22 and electrons from cathode 28. The generated light exits through the transparent ITO anode 22 and the transparent substrate 21 in the direction illustrated by the arrow. Cathode 28 is reflective and acts as a mirror reflecting light towards the substrate. For convention, we will assume that the substrate 21 is at the bottom and the cathode 28 is at the top of device 11.

In order for an OLED, such as that described above, to operate at low voltages (i.e., between 2.5 and 15V) and high power efficiency (i.e., greater than 1 Lm/W), the organic stack is usually less than 350 nm thick, and typically between 150–200 nm thick. This desirable thickness poses many device fabrication challenges. Particularly, any imperfection in the device structure can cause the cathode to be in direct contact (or very close proximity) with the anode. This condition results in an area of much lower resistance than the rest of the stack and is typically referred to as a "short".

A short in a single pixel device can result in an inoperative device, while a short in a passive addressing x-y pixelated device may result in several types of cross-talk depending upon the manner in which the device is driven. Shorts are currently the primary reason for low fabrication yields in OLED technology. Shorts may occur in any of the layers forming the OLED device and may be caused by substrate imperfections, ITO layer irregularities, organic film non-uniformity, handling, etc.

OLED's with thicker organic layers (approx. 1 micron or thicker) have been fabricated, such as "electrochemical cell OLED's", and the symmetrically configured ac light emitting (SCALE) OLED. These devices however, have other disadvantages such as slower turn-on times for electrochemical cell OLED's, and higher AC voltage requirements for SCALE OLED's.

In the past, polyaniline (PANI, the polymeric form of aniline) and PDOT (a type of polythiophene, which is a conducting polymer) have been used as buffer layers between an ITO layer and an organic stack in order to improve efficiency and reliability. Both of these materials are conductive polymers when combined with a "dopant", such as a strong acid or a poly acid (polystyrene sulfonate). The acid effectively "charges" positively the backbone of PANI or PDOT, thus making their electronic structures suitable for charge conduction. While used to some degree of success in reducing the occurrence of shorts when applied over an ITO layer, both PANI and PDOT are very dark in color. This implies that they are intrinsically strongly absorbing, therefore requiring that their thickness be kept below approximately 100 nm to 150 nm if they are to be placed upon an ITO layer (the transparent electrode). Such a thin layer is difficult to fabricate in large scale and will be ineffective at suppressing shorts over large defect areas. Furthermore, PANI and PDOT as currently available are not completely compatible with the solvents and solutions used in current microlithography photoresist methods of patterning OLED's.

Thus, an unaddressed need exists in the industry for a process compatible organic light emitting device that can be fabricated using a current self-limiting layer that is greater in thickness than a few hundred nanometers, operates at low voltages and provides high power efficiency.

SUMMARY OF THE INVENTION

The invention provides an organic light emitting device that operates at low voltage, has high power efficiency, and is simple to fabricate using available techniques. Although not limited to these particular applications, the structure to improve the reliability of organic and polymer light emitting devices and method for producing same is particularly suited for organic light emitting devices. The devices can be fabricated using a process by which the materials comprising the device are vapor deposited into amorphous films, or cast from solutions.

In architecture, the present invention can be conceptualized as an organic light emitting device including an electrode, a current self-limiting structure and an organic stack located between them. The current self-limiting structure resides in contact with the electrode.

In a first alternative embodiment, the current self-limiting structure resides between an electrode and an additional conducting layer.

In a second alternative embodiment of the present invention, the current self-limiting structure is applied as a patterned lattice structure over an electrode.

In yet another alternative embodiment, the current self-limiting structure is applied as a grid, defining windows within which an electrode of the light emitting device may be applied.

The present invention may also be conceptualized as providing a method for increasing the reliability of an organic light emitting device, comprising the following steps.

An organic light emitting device having increased reliability is formed with a current self-limiting structure placed within the organic light emitting device. The current self-limiting structure is formed in continuous contact with an electrode of the organic light emitting device, or can be formed as a grid, or patterned lattice, in contact with an electrode of the organic light emitting device.

The invention has numerous advantages, a few of which are delineated, hereafter, as merely examples.

An advantage of the invention is that it provides light output using a low voltage power supply.

Another advantage of the invention is that the light emitting device operates at high power efficiency.

Another advantage of the invention is that it lends itself to generally available simple fabrication techniques.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE PREFERRED EMBODIMENT

The present invention is typically implemented using a process by which the materials comprising the device are vapor deposited as amorphous films, or cast from solutions. Furthermore, while described in the context of an organic light emitting device, the present invention is applicable to other light emitting structures, for example but not limited to, other light emitting and electroluminescent devices.

Figure 1:
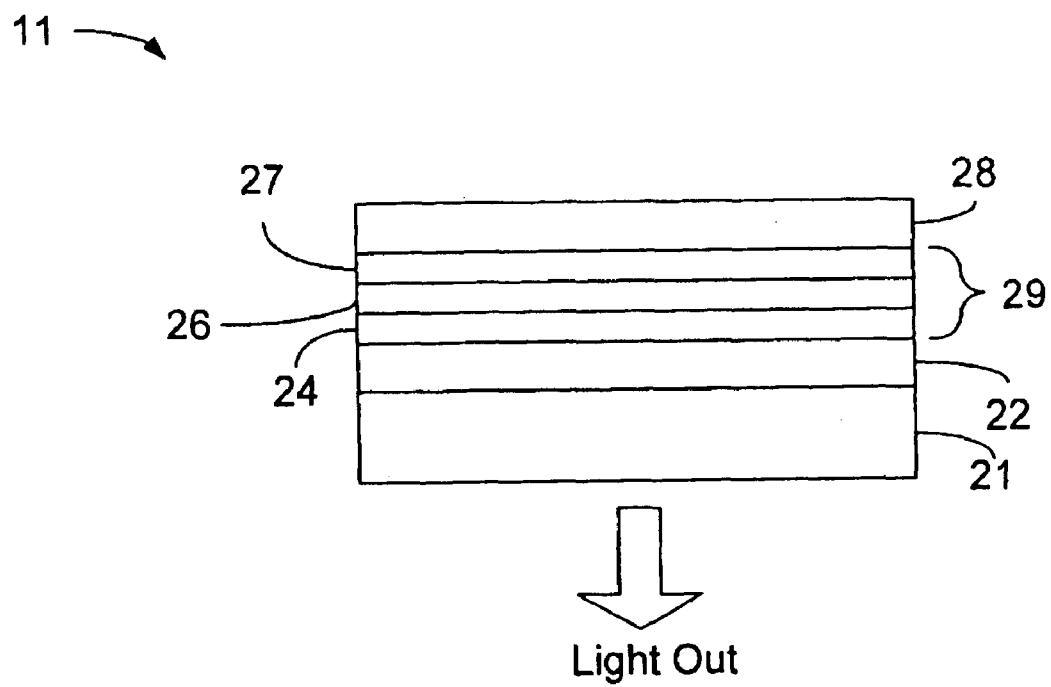
FIG. 1 is a cross-sectional view of a prior art organic light emitting device.
Figure 2:
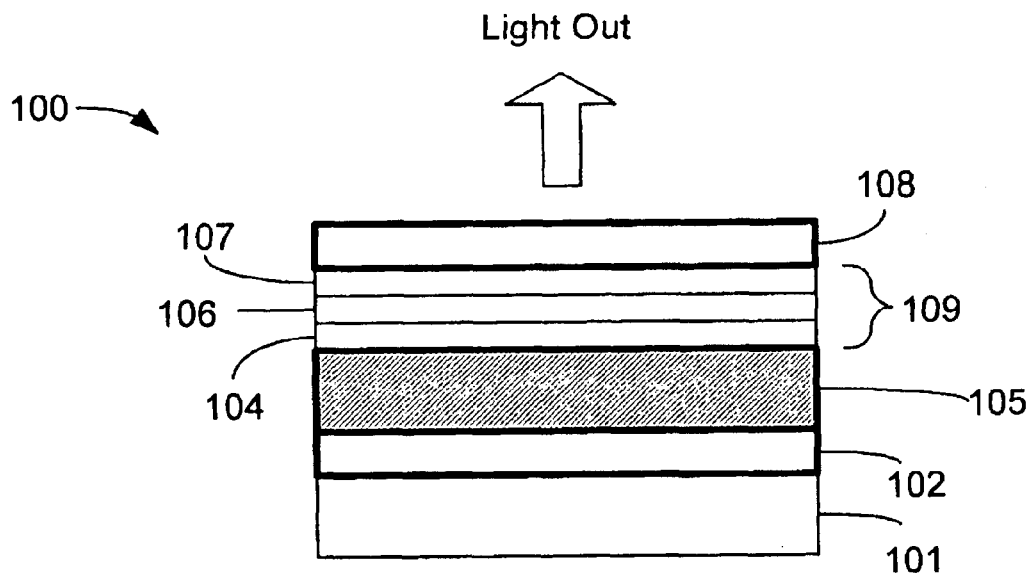
FIG. 2 is a cross-sectional view of an organic light emitting device constructed in accordance with the present invention.

Turning now to FIG. 2, shown is a cross-sectional view of an organic light emitting device assembly 100 constructed in accordance with the present invention. In this preferred embodiment, for convention, the organic light emitting device provides light output in the upward direction; however, device 100 can also emit light in the downward direction.

Essentially, the present invention is the introduction of a current self-limiting structure (or structures) within an organic light emitting device. A current self-limiting structure is made from a conducting material of variable resistance. The material is a relatively good conductor under moderate current flow, but becomes highly resistive, or non-conducting, under high current flow. In the absence of such a layer, current rushes towards an area of low resistance, such as a short in one of the layers of which a light emitting device is constructed. The placement of a current self-limiting structure in the device prevents this current "runaway" in the vicinity of a short.

Current self-limiting materials are those possessing a positive temperature coefficient of resistivity, an example of which is barium titanate ($BaTiO_3$) (See J. Nowotny and M. Rekas, *Ceramics International* Vol. 17, pp. 227–241, 1991). This ceramic material may be formulated in composite structures with polymer or photoresist matrices to achieve the desired current self-limiting behavior.

Another class of current limiting materials is composed of polymer composites, in which the polymer contains inorganic (typically metallic) conducting particles at various concentrations such that a conducting path can be established through the material. When polymers are heated, they generally expand, causing the separation between metal particles to increase, eventually reaching a point where conduction of current is no longer supported. An example of such a material is described, for example, by S. Etemad, et al., in *Applied Physics Letters*, Vol. 48, p. 607 (1986), where it is shown that the transition between conduction and insulation is very abrupt (occurring with a small fractional change in volume). Other examples include the materials known in the field of integrated circuit assembly as "z-axis adhesives" (adhesives that conduct current predominately in the direction perpendicular to the plane of the film), or anisotropically conducting adhesives. In order to function as a current limiter, the volume fraction of metal particles must be high enough to establish a conducing path, but not so high that this path cannot be destroyed by heat.

Several variations on this theme are within the scope of the present invention. For example, the metal particles may be covalently bound to a polymer instead of being randomly dispersed; thereby defining the separation between particles more precisely. An advantage of this approach is that proper choice of polymer medium and processing may result in orientation of the metal particle chains preferentially in the direction of current flow. Consequently, a smaller loading of metal is required and the material can be highly transparent.

A third class of materials suitable for the present invention is that of conducting polymers, in which electrical conductivity is supported without any inorganic materials. These materials, of which an example is polyaniline "doped" with a suitable organic acid to give it either an n-type or p-type characteristic, are conductive as a consequence of specific chemical structural features involving π(pi) conjugation in the polymer backbone. Pi conjugation refers to a condition where the electrons in the covalent bonds of the polymer backbone (the series of carbon atoms connected in a long chain) are delocalized, and hence relatively free to move along the chain, as will be appreciated by those skilled in the art of organic chemistry. This conductivity is lost upon heating the polymer sufficiently to cause reactions that interrupt this conjugation, or which cause de-doping. Such materials have been used in organic LED's to improve charge injection and increase lifetime, but their capability to provide current limiting has heretofore not been considered.

Referring back to FIG. 2, transparent conducting anode 102, typically fabricated from Indium Tin Oxide (ITO), is applied over a transparent substrate 101. ITO anode 102 forms the positive terminal of device 100. Transparent substrate 101 may be for example, glass or plastic. Between ITO anode 102 and organic stack 109 is applied current self-limiting (CSL) structure 105 In this embodiment CSL structure 105 takes the form of a layer applied over ITO anode layer 102. In this application CSL structure 105 becomes effectively the "anode", while the ITO layer 102 serves as a "current bus layer". CSL layer 105 can be applied in a thickness sufficient to prevent excessive current in the vicinity of a short. Over CSL structure 105 is applied one or more organic stack layers 109.

Organic stack 109 may include for example, hole transport layer 104, electroluminescent layer 106, and electron transport layer 107. Organic stack 109 is typically not thicker than 300–500 nm. Cathode layer 108 should be semi-transparent to allow light to pass and is applied over organic stack 109 and forms the negative terminal of device 100. Previously, the cathode material has typically been limited to a metal of relatively low work function such as magnesium (Mg), cadmium (Ca), Ytterbium (Yb), lithium-aluminum (LiAl) alloys, etc. However, by employing the concepts of the present invention, a transparent ITO layer may also be used as a cathode in combination with a suitable electron transport layer.

In addition, in this preferred embodiment and in all the embodiments that follow, CSL structure 105 may be fabricated of an anisotropically conductive self-limiting material. These are materials that can be processed in film form and, in addition to self-limiting any current in the vicinity of a short, pass current predominantly in the direction perpendicular to the plane of the film. The anisotropically conductive self-limiting material can be used to improve further short isolation.

The arrow above organic light emitting device assembly 100 indicates the light output of this preferred embodiment. It should be noted that the light output may be out of the bottom of the device by locating the CSL layer 105 at the top of the device as will be described with respect to FIG. 3.

Furthermore, were CSL layer 105 constructed of a transparent material it would be possible to take the light output from the bottom of device 100, while allowing the CSL layer 105 to be located in contact with ITO anode 102.

The placement of the CSL layer operates to reduce or eliminate the occurrence of high (or runaway) current through a short in any of the material layers described. This is possible because the high current flow in the vicinity of a short in any of the above described layers between ITO anode 102 and cathode 108 causes the CSL material to become highly resistive, or non-conducting. The functionality of the CSL layer will be described in detail with respect to FIGS. 5A, 5B and 5C.

Figure 3:
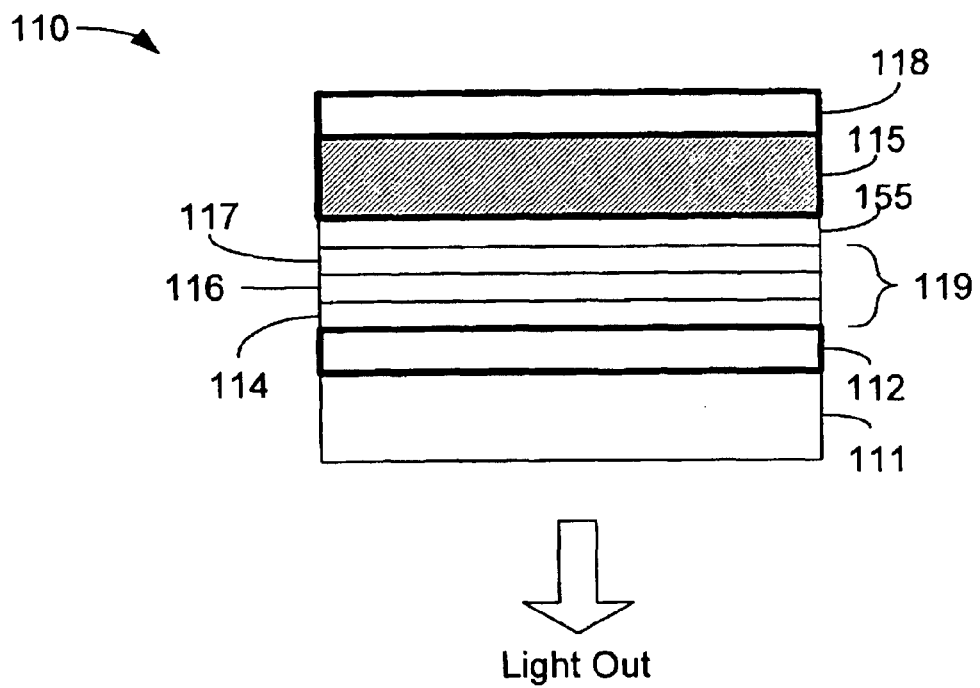
FIG. 3 is a cross-sectional view of a first alternative embodiment of the organic light emitting device of FIG. 2.

FIG. 3 is a cross-sectional view of a first alternative embodiment 110 of the organic light emitting device of FIG. 2. The organic light emitting device 110 depicted in FIG. 3 is similar to that described with respect to FIG. 2, however, the CSL structure 115 resides between cathode 118 and organic stack 119. In this embodiment, CSL structure 115 becomes effectively a cathode, while cathode 118 becomes effectively a bus layer. In similar fashion to that described with respect to FIG. 2, ITO anode 112 is deposited upon transparent substrate 111. Organic stack 119 includes hole transport layer 114, electroluminescent layer 116, and electron transport layer 117.

Deposited over organic stack 119 is CSL structure 115. Cathode (i.e., bus layer) 118 is deposited over CSL structure 115 and forms the reflective layer that enables the light output out of the bottom of device 110 as indicated by the downwardly pointing arrow. In this embodiment, CSL structure need not be transparent because it is not located in the light output path of device 110. In this embodiment, cathode 118 may be comprised of any conducting material (i.e., it is no longer comprised of a low work function material). Furthermore, because CSL structure 115 is effectively functioning as a cathode, it should be chosen so as to be capable of injecting electrons into organic stack 119. Alternatively, injection layer 155 injects electrons into organic stack 119. Injection layer 155 may be a non-metallic conductor and can be, for example, an organic compound such as copper phthalocyanine, or an inorganic compound such as lithium fluoride. Alternatively, injection layer 155 may be a very thin (on the order of 0.3–7 nm) metallic structure such that it has negligible lateral conductivity.

Injection layer 155 provides charge injection for the device 110 in this alternative embodiment in which CSL structure 115 is comprised of an anisotropically conducting material.

Figure 4A:
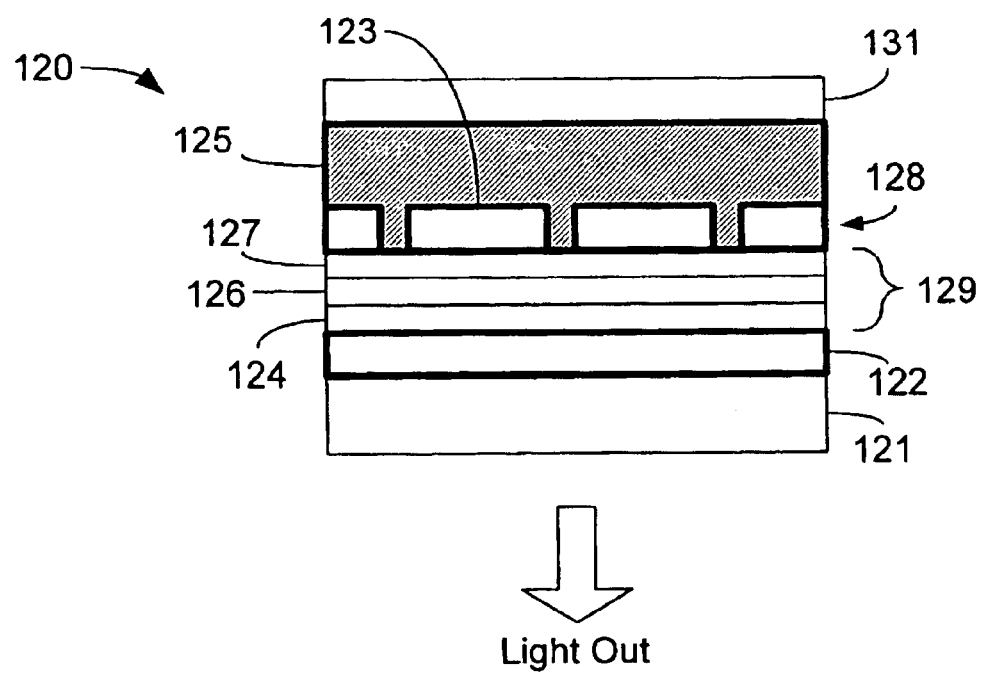
FIG. 4A is a cross-sectional view of a second alternative embodiment of the organic light emitting device of FIG. 2.

FIG. 4A is a cross-sectional view of a second alternative embodiment of the organic light emitting device of FIG. 2. In the light emitting device 120 shown in FIG. 4A, the CSL structure is inserted between one or both electrodes and an additional conducting layer, or "bus layer" 131. The bus layer supplies current over the entire surface of the device. In the embodiment illustrated in FIG. 4A, the CSL structure is located between cathode 128 and an additional bus layer 131, however, the CSL structure may also be placed between the anode and an additional bus layer.

ITO anode 122 is deposited over transparent substrate 121 in similar fashion to that described with respect to FIGS. 2 and 3. Organic stack 129, which includes hole transport layer 124, electroluminescent layer 126, and electron transport layer 127, is deposited over ITO anode 122. In a departure from that described in FIGS. 2 and 3, cathode 128 is deposited over organic stack 129 as a plurality of cathode segments, an exemplary one of which is illustrated as segment 123. Over and between each cathode segment 123 is deposited the CSL structure 125 of this embodiment. As can be seen from FIG. 4A, CSL structure 125 both covers and surrounds cathode segments 123. Bus layer 131 is applied over CSL structure 125 and functions as an additional electrode supplying current over the entire surface of device 120.

Figure 4B:
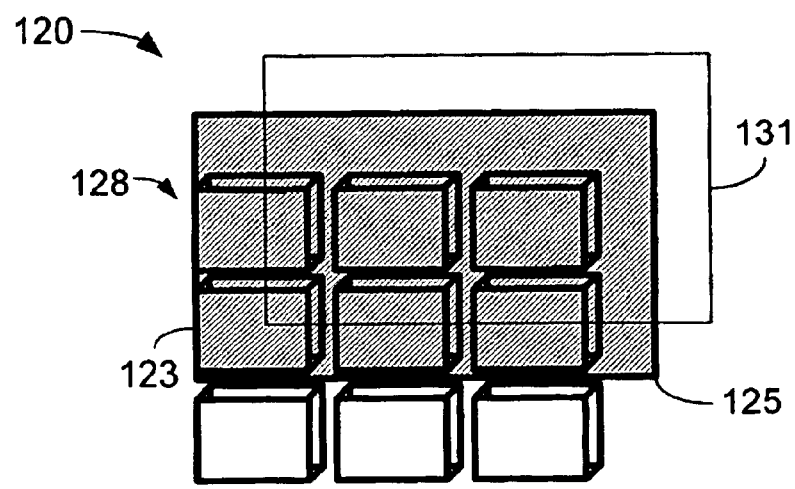
FIG. 4B is a perspective view of the second alternative embodiment of the organic light emitting device of FIG. 4A.

To illustrate further the concept mentioned above with respect to FIG. 4A, turn now to FIG. 4B, which is a perspective view illustrating the device 120 of FIG. 4A. Bus layer 131 completely covers the surface of the device. Beneath bus layer 131 is CSL structure 125, which is illustrated as a continuous layer. Cathode 128 is illustrated as segments 123 to illustrate the manner in which CSL structure 125 both covers and separates cathode segments 123. In this configuration, the CSL structure 125 need not be fabricated from a very conductive material because the device efficiency is determined by the injection characteristics of the cathode (or anode). Because it is desirable that no contact take place between the cathode 128 and the bus layer 131, the CSL structure 125 should have sufficient thickness to ensure that it is free of pinholes. Furthermore, because the CSL structure is located near the cathode, transparency is not required. CSL structure 125 may alternatively be located in contact with ITO anode 122 in similar fashion to that described above.

CSL structure 125 may also be fabricated of an anisotropically conductive self-limiting material. These are materials that can be processed in film form and, in addition to self-limiting any current in the vicinity of a short, pass current predominantly in the direction perpendicular to the plane of the film.

Figure 5A:
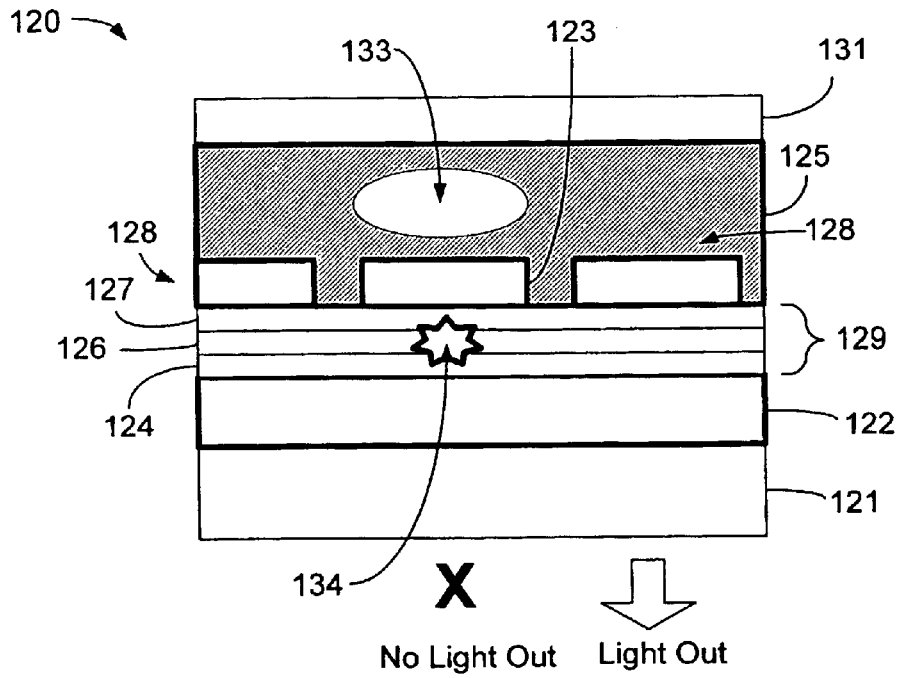
FIGS. 5A and 5B collectively illustrate the functionality of the current self-limiting structure of FIGS. 2, 3, 4A and 4B.
Figure 5B:
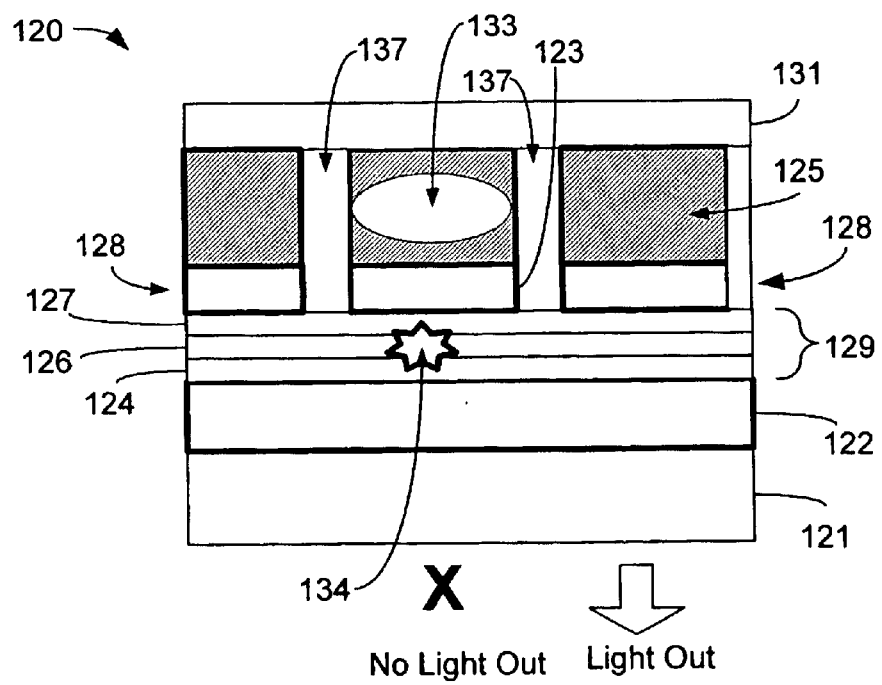

FIGS. 5A and 5B collectively illustrate the functionality of the CSL structure of FIGS. 2, 3, 4A and 4B. FIGS. 5A and 5B specifically illustrate the structure of the organic light emitting device of FIGS. 4A and 4B, however, the CSL structure functions as illustrated herein irrespective of the configuration employed.

Turning now to FIG. 5A, ITO anode 122 is deposited over transparent substrate layer 121 in similar fashion to that described above. Organic stack 129, which includes hole transport layer 124, electroluminescent layer 126, and electron transport layer 127, is deposited over ITO anode 122. Over organic stack 129 is deposited cathode 128 as segments 123 as illustrated with respect to FIGS. 4A and 4B. Over and between each cathode segment 123 is deposited CSL structure 125 in a continuous manner similar to that described with respect to FIGS. 4A and 4B. Bus layer 131 is applied over CSL structure 125 and supplies current over the entire surface of device 120.

To illustrate the functionality of CSL structure 125, assume that short 134 occurs somewhere within organic stack 129. Short 134 may occur in any layer of device 120 and is shown as occurring in organic stack 129 simply for illustrative purposes. Without a CSL structure, current will rush toward short 134 between ITO anode 122 and cathode 128. By including CSL structure 125 between one electrode, here cathode 128, and a corresponding bus layer 131, the high current flow in the vicinity of short 134 causes the CSL structure 125 in the vicinity of the short to become resistive, or non-conductive. This condition is illustrated by high resistance region 133 located within CSL structure 125 between bus layer 131 and cathode segment 123. In addition, by patterning the electrode, cathode 128 in this embodiment as a plurality of electrically isolated regions, or segments 123, in the lateral direction current leakage from neighboring areas through the conducting electrode is significantly reduced. This leakage could occur should the electrode be applied as a monolithic film. If the surface area of each segment is sufficiently small, then CSL structure 125 should be prevented from supplying current from neighboring areas.

The area corresponding to a segment having a short does not illuminate, as illustrated by the absence of light emanating from the bottom of the device beneath short 134. By constructing the device with small segments, the non-emissive areas in the device win be d, resulting in a display device having higher reliability. Furthermore, fabricating the CSL structure 125 using an anisotropically conducting self-limiting material, improves further the reliability of the device. Anisotropically conducting current self-limiting material as stated above, conducts current predominately in the direction perpendicular to the plane of the film. Because anisotropically conducting CSL material predominately draws current only from the area corresponding to the electrode thereunder, it provides further current isolation in the event of a short.

FIG. 5B is a cross-sectional view of the organic light emitting device of FIG. 4A illustrating the application of the CSL structure as discrete patches, or a patterned lattice structure in which the CSL structure is segmented, corresponding to cathode segments 123. Remembering back to FIG. 5A, CSL structure 125 was applied as a continuous film, or layer. By applying CSL structure 125 as discrete patches the formation of insulating gap 137 between patches of CSL structure 125 may provide increased short isolation. Alternatively, were CSL structure 125 constructed of an anisotropically conducting material, the segmenting of CSL structure 125 would be unnecessary.

Figure 5C:
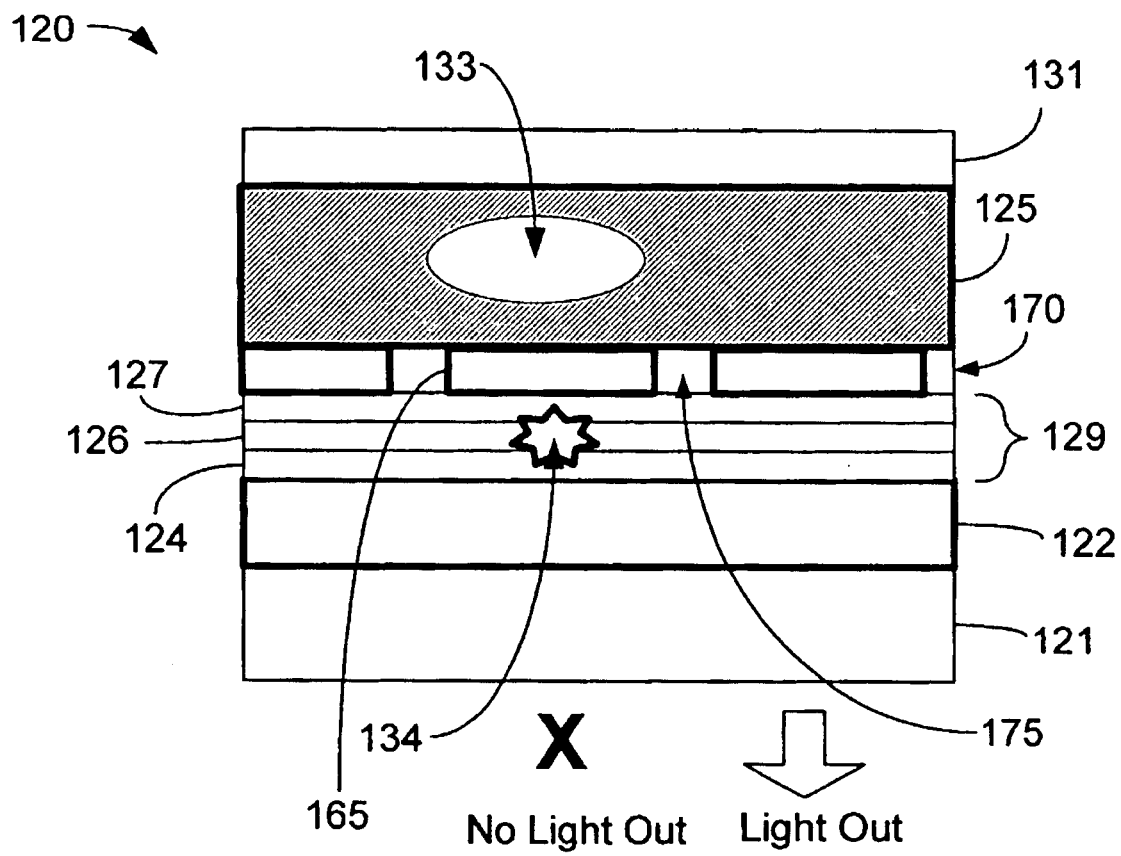
FIG. 5C is a cross-sectional view illustrating an alternative embodiment of the cathode of the device of FIG. 5A.

FIG. 5C is a cross-sectional view illustrating an alternative embodiment of the cathode of the device of FIG. 5A One manner in which the functionality of the segmented cathode (123 of FIG. 5A) may be attained without segmenting the cathode is through the use of a composite film 170. Composite film 170 includes conducting regions 165, which are made of conducting particles, such as coated polymer spheres, grains, etc., dispersed in a non-conducting matrix 175. Non-conducting matrix 175 and conducting regions 165 together form composite matrix 170. The conducting particles that comprise conducting region 165 and that contact electron transport layer 127 of organic stack 129 are electrically equivalent to the segments 123 of cathode 128. Alternatively, injection layer 155 may be placed between organic stack 129 and CSL structure 125, the function of which was described above with reference to FIG. 3.

Composite mate 170 is an anisotropically conducting layer exhibiting high resistance in the areas of non-conducting matrix 175 between conducting regions 165. An advantage of this structure is that the patterning of cathode 123 into segments 123 (FIGS. 5A and 5B) may be omitted.

Figure 6A:
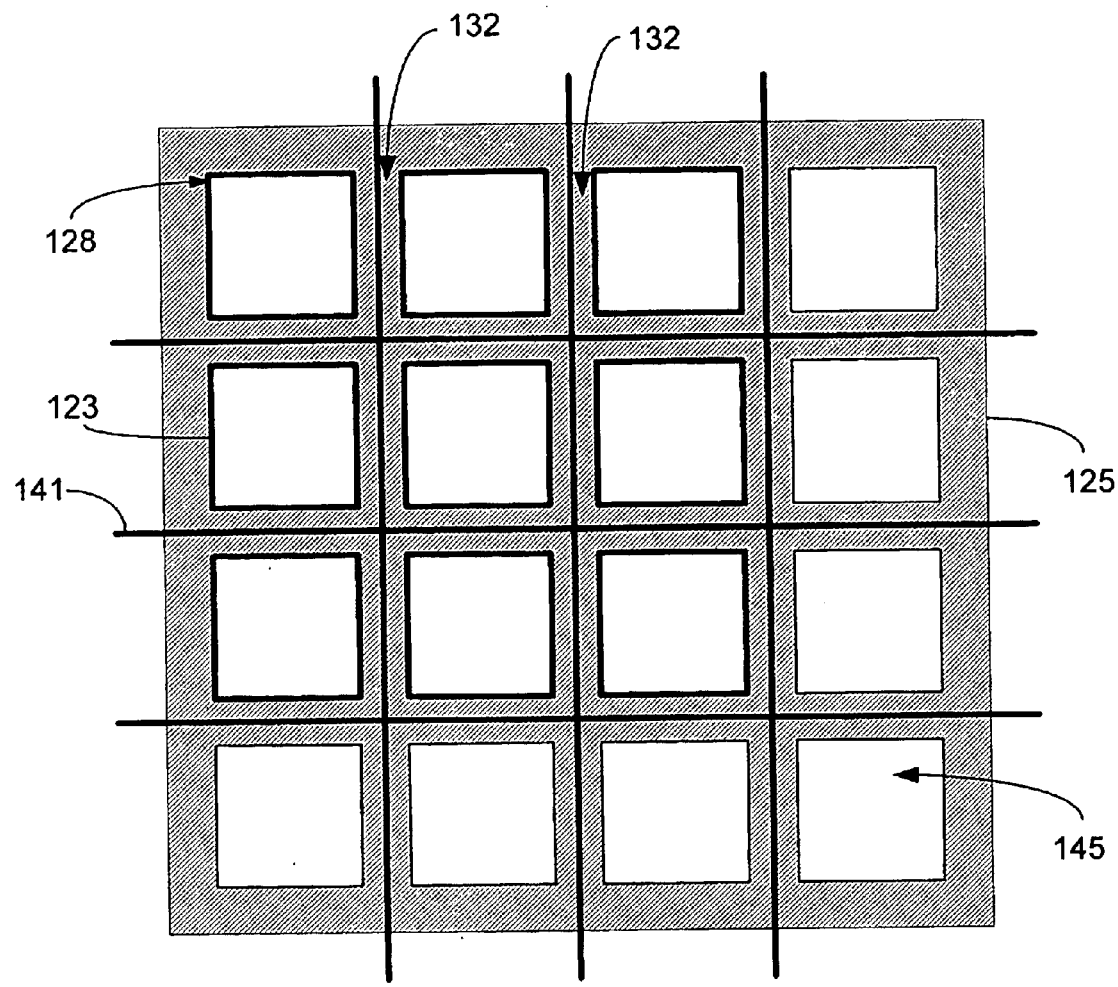
FIG. 6A is a plan view of a variation to the organic light emitting device of FIGS. 5A and 5B having the current self-limiting structure applied in conjunction with a cathode.

FIG. 6A is a plan view of a variation to the organic light emitting device of FIGS. 5A and 5B having the current self-limiting structure applied in conjunction with a cathode. In this embodiment, CSL structure 125 is formed as a grid structure defining windows 145. The window areas 145 are free of CSL material. The windows 145 formed in CSL structure 125 may have an electrode (e.g., cathode 128) applied therein, thus forming cathode segments 123. Window areas 145 having cathode segments 123 are illustrated using bold lines to illustrate the placement of cathode segments 123. CSL structure 125 bridges the spaces between cathode segments 123. In this embodiment, the bus layer 131 (of FIGS. 4A, 4B, 5A and 5B) is replaced with bus lines 141, which deliver current to cathode segments 123 through the thin bridges 132 of CSL material between cathode segments 123 and bus fines 141.

Figure 6B:
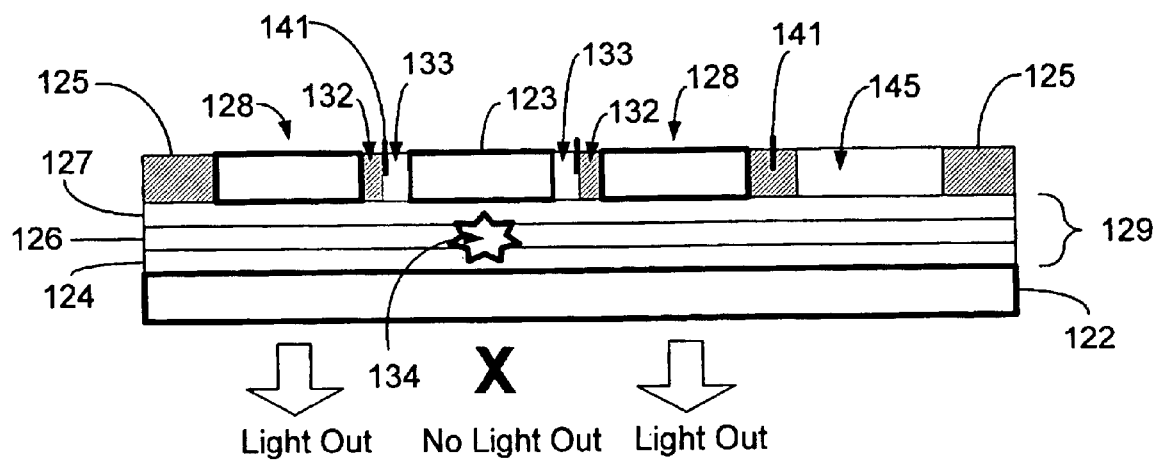
FIG. 6B is a cross-sectional view illustrating the device of FIG. 6A.

FIG. 6B is a cross-sectional view illustrating the device of FIG. 6A. Over ITO anode 122 is organic stack 129, which includes hole transport layer 124, electroluminescent layer 126, and electron transport layer 127. Over organic stack 129 is deposited CSL structure 125 in the form of a grid. CSL grid 125 is patterned as described above so as to define windows 145. The window areas 145 are free of CSL material. Cathode segments 123 fill the windows 145 defined by CSL structure 125. Bus lines 141 are deposited over CSL structure 125 in such a way as to facilitate the transport of current to cathode segments 123. Current is passed from bus lines 141 to cathode segment 123 across the thin bridges 132 of CSL material separating cathode segments 123.

Illustratively, short 134 occurs within organic stack 129, causing current to rush to that location between cathode segment 123 and ITO anode 122. Once the short occurs, CSL structure 125 will become resistive, or non-conducting in the region 133 between bus line 141 and cathode segment 123. The highly resistive areas indicated in region 133 will prevent current from flowing through the short 134, and will localize the non-emissive region to an area sufficiently small to minimize negative impact to the display. As can be seen by the arrows indicating light output, the regions adjoining the area in which short 134 occurred maintain their ability to provide light output, thus minimizing the negative effect of the short.

Figure 7A:
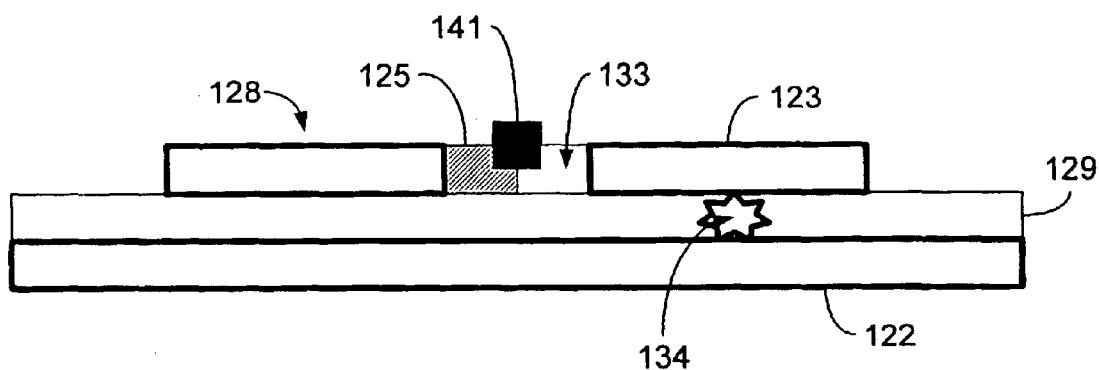
FIG. 7A is a detail view of the current self-limiting structure of FIG. 6B.

FIG. 7A is a detail view of the CSL structure of FIG. 6B. As can be seen, due to the grid structure of CSL material discussed in FIG. 6B, cathode segments 123 are separated by areas of CSL structure 125. Bus line 141 is applied over CSL structure 125 so that current may be delivered to cathode segment 123 across the thin area of CSL material separating bus line 141 and cathode segment 123. If a short 134 occurs between ITO anode 122 and cathode segment 123, CSL structure 125 becomes highly resistive in the area 133 between bus line 141 and cathode segment 123, thus limiting the flow of current through cathode segment 123 having short 134 thereunder.

Following are several alternative configurations of the CSL structure 125. The following examples are merely a few possible configurations of the CSL material. Many variations are possible without departing from the scope of the present invention. In all following configurations the operation of CSL structure 125 is similar to that described above.

Figure 7B:
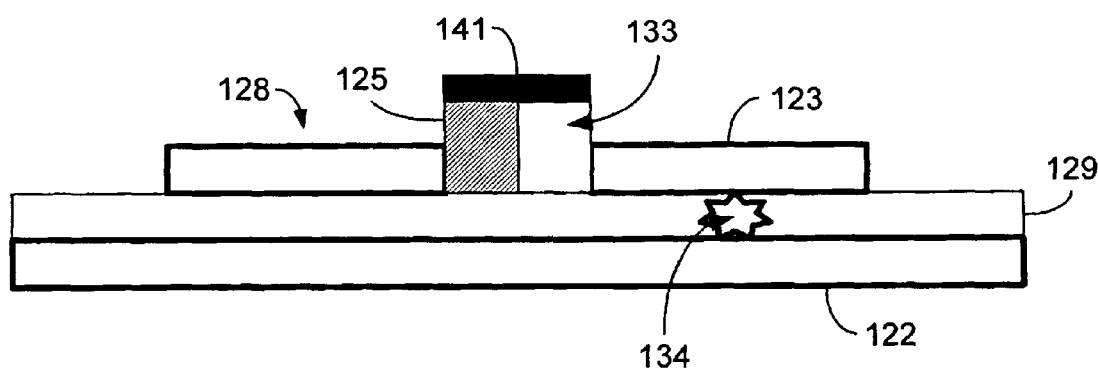
FIG. 7B is a schematic view of an alternative configuration of the current self-limiting structure of FIG. 7A.

FIG. 7B is a schematic view of an alternative configuration of the current self-limiting structure of FIG. 7A. Bus line 141 is deposited completely over CSL structure 125. This configuration allows simplified construction in that the CSL structure 125 may be deposited either before or after cathode 128.

Figure 7C:
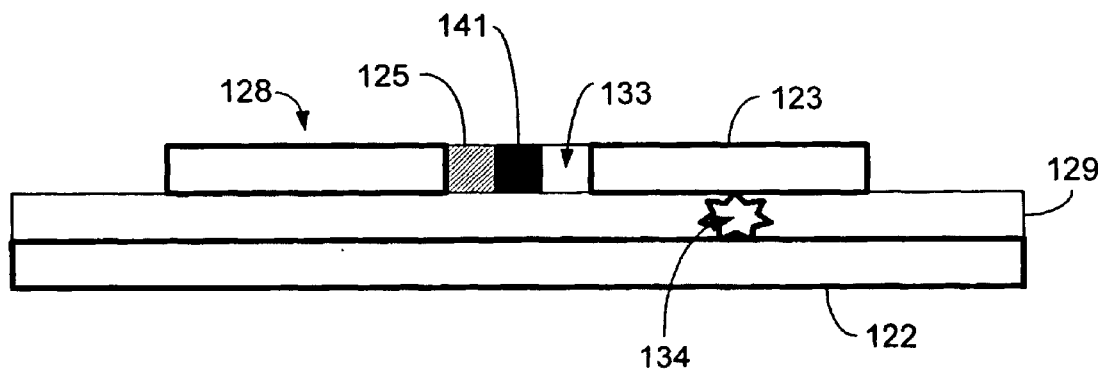
FIG. 7C is a schematic view of another alternative configuration of the current self-limiting structure of FIG. 7A.

FIG. 7C is a schematic view of another alternative configuration of the current self-limiting structure of FIG. 7A. In this embodiment, bus line 141 extends through CSL structure 125 to organic stack 129. This configuration allows the CSL structure to be relatively thin and allows the structure to be planar. In addition, this configuration allows the CSL structure to be deposited before or after the deposition of cathode 128.

Figure 7D:
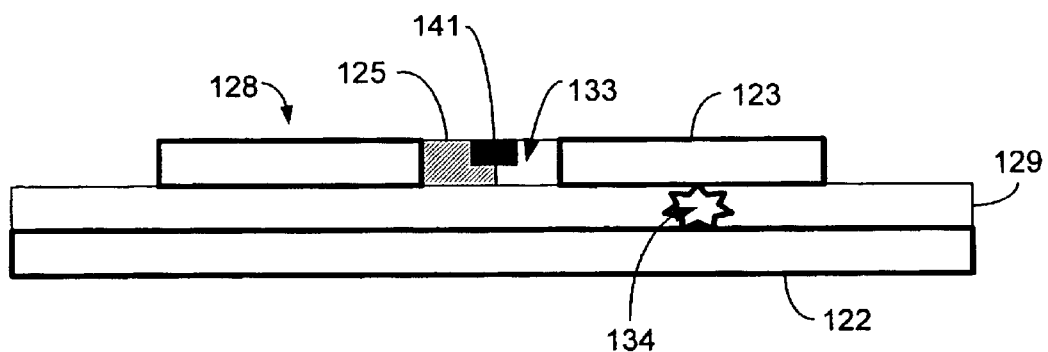
FIG. 7D is a schematic view of yet another alternative configuration of the current self-limiting structure of FIG. 7A.

FIG. 7D is a schematic view of yet another alternative configuration of the current self-limiting structure of FIG. 7A. CSL structure 125 completely fills the space between cathode 128 and has bus line 141 deposited within CSL structure 125. This configuration is a variation of that described in FIGS. 7B and 7C and allows the structure to be planar.

Figure 7E:
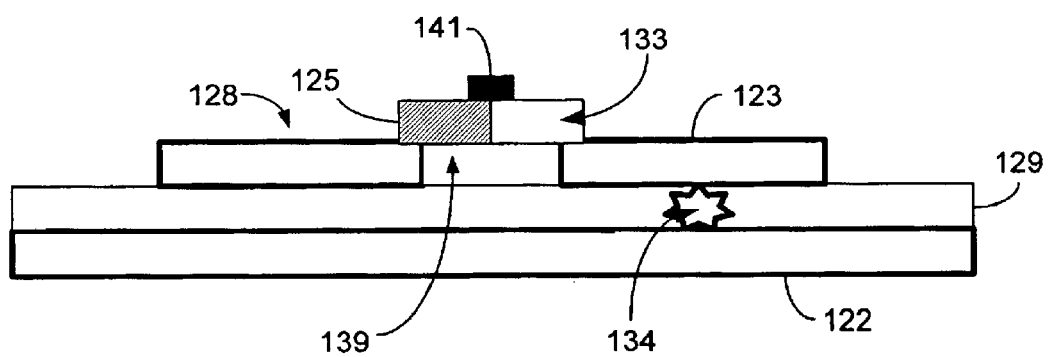
FIG. 7E is a schematic view of still another alternative configuration of the current self-limiting structure of FIG. 7A.

FIG. 7E is a schematic view of still another alternative configuration of the current self-limiting structure of FIG. 7A. Photoresist material 139 fills the space between cathode segments 123. CSL structure 125 is deposited over photoresist material 139 so that it contacts cathode 128. Bus line 141 is deposited over CSL structure 125. This configuration allows a small region of contact between cathode 128 and CSL structure 125.

Figure 8A:
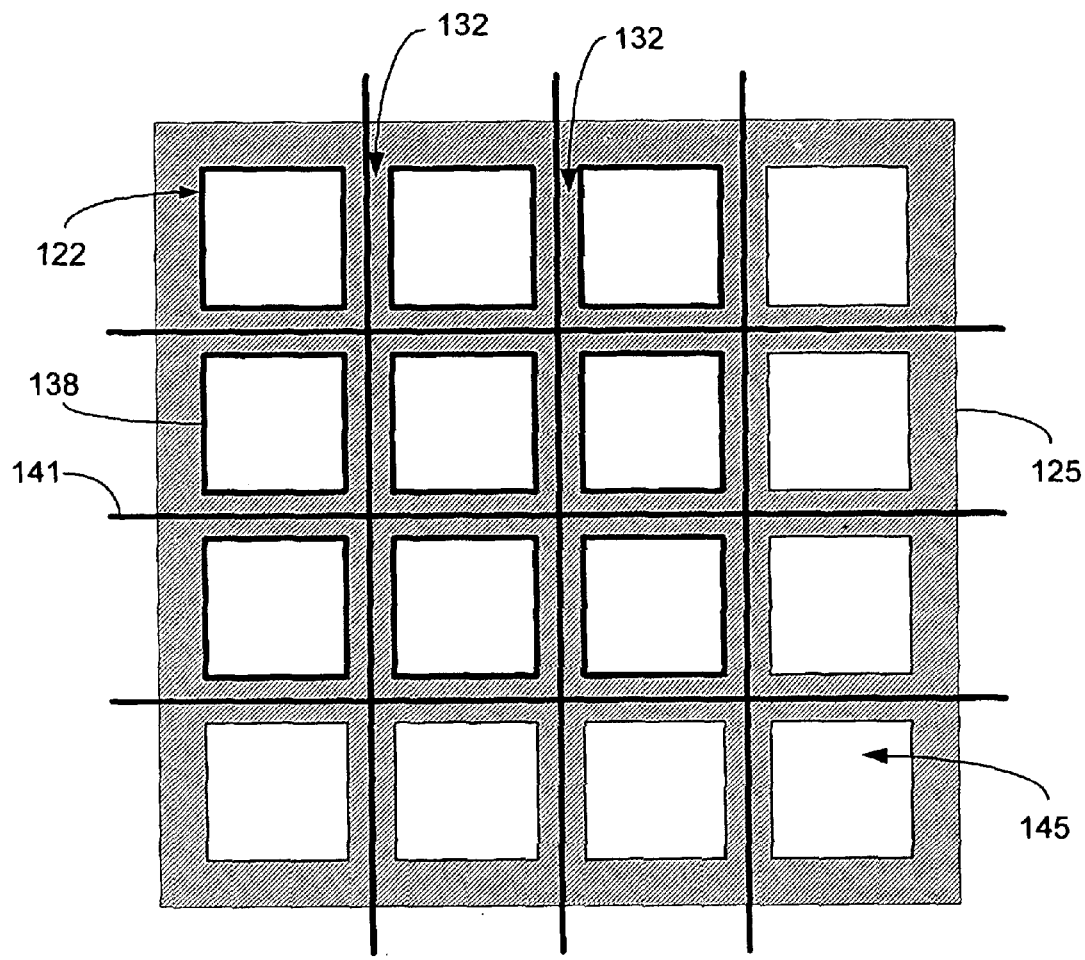
FIG. 8A is a plan view of a variation to the organic light emitting device of FIG. 6A having the current self-limiting structure applied in conjunction with an anode.

FIG. 8A is a plan view of a variation to the organic light emitting device of FIG. 6A having the current self-limiting structure applied in conjunction with an anode. In the following configuration, CSL structure 125 is formed as a grid structure defining windows 145 in similar fashion to that described with reference to FIG. 6A. However, because the CSL material is applied in conjunction with ITO anode 122, the grid structure of CSL structure 125 allows a non-transparent CSL material to be used, thus preventing excessive current from flowing in the vicinity of a short while allowing light to pass in regions that are operating properly (i.e., no shorting). The window areas 145 are free of CSL material. In similar fashion to that described above with respect to FIG. 6A, the windows 145 defined by CSL structure 125 may have electrode segments applied therein, thus forming ITO anode segments 138. Window areas 145 having anode segments 138 are illustrated using bold lines to illustrate the placement of anode segments 138. CSL material bridges the spaces between ITO anode segments 138. In this embodiment, bus layer 131 (of FIGS. 4A, 4B, 5A and 5B) is replaced with bus lines 141, which deliver current to anode segments 138 through the thin bridges 132 of CSL material between anode segments 138 and bus lines 141.

Figure 8B:
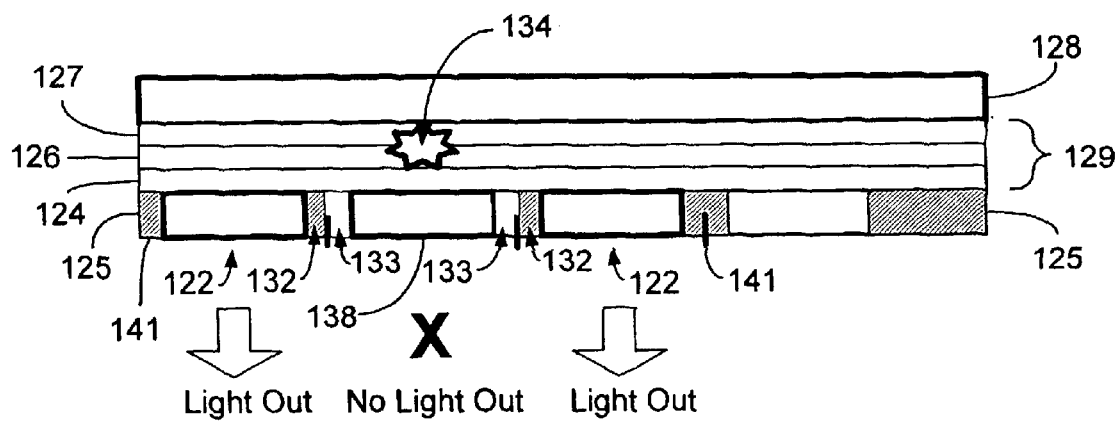
FIG. 8B is a cross-sectional view illustrating the device of FIG. 8A.

FIG. 8B is a cross-sectional view illustrating the device of FIG. 8A.

On the bottom of organic stack 129, which includes hole transport layer 124, electroluminescent layer 126, and electron transport layer 127 is applied CSL structure 125 in the form of a grid. CSL grid 125 is patterned as described above so as to define windows 145. The window areas 145 are free of CSL material. ITO anode segments 138 are deposited in the windows 145 defined by CSL structure 125. Bus lines 141 are deposited over CSL structure 125 in such a way as to facilitate the transport of current to ITO anode segments 138. Current is passed from bus lines 141 to ITO anode segments 138 across the thin bridges 132 of CSL material separating ITO anode segments 138.

Illustratively, short 134 occurs within organic stack 129, causing current to rush to that location between cathode 128 and ITO anode segment 138. Once the short occurs, CSL structure 125 will become resistive, or non-conducting in the region 133 between bus line 141 and ITO anode segment 138. The highly resistive areas indicated by region 133 will prevent current from flowing through the short 134, and will localize the non-emissive region to an area sufficiently small to minimize negative impact to the display. As can be seen by the arrows indicating light output, the regions adjoining the area in which short 134 occurred maintain their ability to provide light output, thus minimizing the negative effect of the short. An advantage to this configuration is that there is no need to pattern the cathode in single pixel applications (such as backlights) and that the CSL structure is part of the "substrate" (i.e., it is fabricated prior to casting the organic stack).

It will be obvious to those skilled in the art that many modifications and variations may be made to the preferred embodiments of the present invention, as set forth above, without departing substantially from the principles of the present invention. All such modifications and variations are intended to be included herein within the scope of the present invention, as defined in the claims that follow.

What is claimed is:

1. An organic light emitting device, comprising:

an electrode;

a transparent current self-limiting structure comprising an anisotropic film, said current self-limiting structure comprising conducting regions, said conducting regions comprising a unitary material dispersed in a non-conducting matrix, said current self-limiting structure located between said electrode and a bus layer; and an organic stack located adjacent said electrode and separated from said current self-limiting structure by said electrode.

2. The device as defined in claim 1, wherein said current self-limiting structure resides in contact with said electrode.

3. The device as defined in claim 1, wherein said current self-limiting structure is applied as a patterned lattice structure over said electrode.

4. The device as defined in claim 1, wherein said current self-limiting structure is applied as a grid defining windows in which said electrode is applied.

5. The device as defined in claim 1, further including a photoresist material in contact with said current self-limiting structure and said electrode.

6. The device as defined in claim 1, wherein said bus layer is embedded within said current self-limiting structure.

7. The device as defined in claim 1, wherein said bus layer resides over said current self-limiting structure.

8. The device as defined in claim 1, wherein said current self-limiting structure is a ceramic material and the matrix is a photoresist material.

9. The device as defined in claim 1, wherein said current self-limiting structure is a ceramic material and the matrix is a polymer.

10. The device as defined in claim 1, wherein said current self-limiting structure is a polymer composite containing inorganic conducting particles.

11. The device as defined in claim 1, wherein said current self-limiting structure is a conductive polymer.

12. A method for increasing the reliability of an organic light emitting device, comprising the steps of:

forming an organic light emitting device including an organic stack; and incorporating a transparent current self-limiting structure comprising an anisotropic film, said current self-limiting structure comprising conducting regions, said conducting regions comprising a unitary material dispersed in a non-conducting matrix within said organic light emitting device, said current self-limiting structure residing between an electrode and a bus layer, and wherein said current self-limiting is separated from said organic stack by said electrode.

13. The method as defined in claim 12, wherein said current self-limiting structure is formed in contact with said electrode of said organic light emitting device.

14. The method as defined in claim 12, wherein said current self-limiting structure is formed as a patterned lattice in contact with said electrode of said organic light emitting device.

15. The method as defined in claim 12, wherein said current self-limiting structure is applied as a grid defining windows in which said electrode of said organic light emitting device is applied.

16. The method as defined in claim 12, wherein said current self-limiting structure is formed using a ceramic material and the matrix is formed using a photoresist material.

17. The method as defined in claim 12, wherein said current self-limiting structure is formed using a ceramic material and the matrix is formed using a polymer.

18. The method as defined in claim 12, wherein said current self-limiting structure is formed using a polymer composite containing inorganic conducting particles.

19. The method as defined in claim 12, wherein said current self-limiting structure is formed using a conductive polymer.

* * * * *